US006925406B2

United States Patent
Kellerman et al.

(10) Patent No.: US 6,925,406 B2
(45) Date of Patent: Aug. 2, 2005

(54) SCAN TEST VIEWING AND ANALYSIS TOOL

(75) Inventors: David S. Kellerman, Lake Oswego, OR (US); Steven R. Morris, Portland, OR (US); Andrew H. Levy, Aloha, OR (US)

(73) Assignee: Teseda Corporation, Portland, OR (US)

( * ) Notice: Subject to any disclaimer, the term of this patent is extended or adjusted under 35 U.S.C. 154(b) by 18 days.

(21) Appl. No.: 10/600,238

(22) Filed: Jun. 19, 2003

(65) Prior Publication Data

US 2004/0078165 A1 Apr. 22, 2004

(Under 37 CFR 1.47)

Related U.S. Application Data

(60) Provisional application No. 60/390,561, filed on Jun. 21, 2002.

(51) Int. Cl.[7] .............................................. G06F 19/00
(52) U.S. Cl. ...................... 702/119; 702/59; 702/117; 702/119; 702/123; 716/4; 716/18; 714/30; 714/726; 370/241; 703/14; 324/765
(58) Field of Search ...................... 702/57–59, 117–120, 702/122–123; 716/4, 18; 714/30, 726; 370/241; 327/218; 703/14; 324/765

(56) References Cited

U.S. PATENT DOCUMENTS

| 6,704,895 B1 | * | 3/2004 | Swoboda et al. ............ 714/726 |
| 2001/0022743 A1 | * | 9/2001 | Sato et al. ............. 365/189.03 |
| 2002/0073374 A1 | * | 6/2002 | Danialy et al. ............. 714/738 |
| 2004/0004216 A1 | * | 1/2004 | Eldridge et al. .............. 257/48 |

OTHER PUBLICATIONS

Winters, ' Using IEEE–1149.1 For In–Circuit Simulation', Sep. 27–29, 1994 , IEEE Article, pp. 525–528.*

Burgess Jr., et al., 'Boundary Scan', Aug./Sep. 1995, IEEE Article, pp. 11–12.*

* cited by examiner

Primary Examiner—Marc S. Hoff
Assistant Examiner—Elias Desta
(74) Attorney, Agent, or Firm—Klarquist Sparkman, LLP

(57) ABSTRACT

A scan test viewing and analysis tool for an integrated circuit tester provides inter-related views of scan tests on an integrated circuit device. The tool processes a test program specification, execution results and device definition to produce cross-referencing data, which the tool then uses to provide navigation links between correlated locations in a cyclized test view, procedural test program view, and views of signal vectors, scan state and scan vectors. The tool also provides a capability to edit the test program in the views.

3 Claims, 7 Drawing Sheets

FIGURE 2.

1200 — TEST SETUP/RESULT VECTORS (SCAN CELLS AND SIGNALS)

|    | TEST 1 SETUP | TEST 1 RESULTS | TEST 2 SETUP | TEST 2 RESULTS |
|----|----|----|----|----|
| S1 | 0  | -  | 1  | -  |
| S2 | 1  | -  | 0  | -  |
| S3 | 0  | -  | 1  | -  |
| S4 | -  | 1  | -  | 1  |
| S5 | -  | 1  | -  | 0  |
| S6 | -  | 0  | -  | 1  |
| C1 | 0  | 1  | 1  | 0  |
| C2 | 1  | 0  | 1  | 1  |
| C3 | 0  | 0  | 0  | 0  |
| C4 | 0  | 1  | 0  | 1  |
| C5 | 1  | 0  | 1  | 0  |
| C6 | 1  | 1  | 1  | 1  |
| C7 | 0  | 1  | 0  | 0  |
| C8 | 1  | 0  | 0  | 1  |

1210 — TEST PROGRAM, NO TEST OVERLAP

TEST 1:
    SHIFT    S2 = 0010, S3 = 1000
    CYCLE    S1 = 0, S2 = 1, S3 = 0
    CYCLE    S4 = H, S5 = H, S6 = L
    SHIFT    S5 = HLHL, S6 = LHHL

TEST 2:
    SHIFT    S2 = 0011, S3 = 0000
    CYCLE    S1 = 1, S2 = 0, S3 = 1
    CYCLE    S4 = H, S5 = L, S6 = H
    SHIFT    S5 = HLLH, S6 = HLHL

TEST PROGRAM, LOAD/UNLOAD OVERLAP

TEST 1:
    SHIFT    S2 = 0010, S3 = 1000
    CYCLE    S1 = 0, S2 = 1, S3 = 0
    CYCLE    S4 = H, S5 = H, S6 = L
TEST 2:
    SHIFT    S2 = 0011, S3 = 0000,
    1220 —     S5 = HLHL, S6 = LHHL    END OF TEST 1
    CYCLE    S1 = 1, S2 = 0, S3 = 1
    CYCLE    S4 = H, S5 = L, S6 = H
    SHIFT    S5 = HLLH, S6 = HLHL

| CYCLIZED TEST PROGRAM | | | | | | | | | | | | | | | | |
|---|---|---|---|---|---|---|---|---|---|---|---|---|---|---|---|---|
| CYCLE | 1 | 2 | 3 | 4 | 5 | 6 | 7 | 8 | 9 | 10 | 11 | 12 | 13 | 14 | 15 | 16 |
| S1 | - | - | - | - | 0 | - | - | - | - | - | 1 | - | - | - | - | - |
| S2 | 0 | 0 | 1 | 0 | 1 | - | 0 | 0 | 1 | 1 | 0 | - | - | - | - | - |
| S3 | 1 | 0 | 0 | 0 | 0 | - | 0 | 0 | 0 | 0 | 1 | - | - | - | - | - |
| S4 | - | - | - | - | - | - | H | - | - | - | - | - | H | - | - | - |
| S5 | - | - | - | - | - | H | H | L | H | L | - | L | H | L | L | H |
| S6 | - | - | - | - | - | L | L | H | H | L | - | H | H | L | H | L |

Columns annotations:
- Cycle 1: TEST 1 LOAD
- Cycle 6: TEST 1 LAUNCH
- Cycle 7: TEST 1 CAPTURE
- Cycle 8: TEST 1 UNLOAD / TEST 2 LOAD
- Cycle 12: TEST 2 LAUNCH
- Cycle 13: TEST 2 CAPTURE
- Cycle 14: TEST 2 UNLOAD

SCAN TEST VIEWING AND ANALYSIS TOOL

CROSS-REFERENCE TO RELATED APPLICATIONS

This application claims the benefit of U.S. Provisional Patent Application No. 60/390,561, filed Jun. 21, 2002, the disclosure of which is incorporated herein by reference.

TECHNICAL FIELD

The present invention relates to scan testing of semiconductor integrated circuits.

BACKGROUND

Traditional Functional IC Test

Traditional functional Integrated Circuit (IC) testing exercises the Device Under Test (DUT) in its normal operational mode. That is, by applying values to the pins of the device and measuring the results, it uses the normal operation of the IC to put the internal device logic into states that allow particular faults to be detected.

There is wide variation in how tests are organized and applied to the device in traditional test. In general terms, to perform a test the DUT is clocked through multiple cycles, with a specified pattern of inputs applied and outputs measured at each cycle. A Test Program consists of a sequence of these tests. Tests do not overlap; however, there may be complex interdependencies between tests (one test relying on a previous test having placed the DUT in a particular state).

IC Test Systems today are designed to perform these sorts of tests. (By Test System, we mean the combination of a Tester, which exercises the DUT, and the accompanying hardware and software system that has access to and control of the Tester.) These testers employ an internal format to specify the Test Program. The details are specific to each Test System, but all represent the data in cyclized form, with Force values (input value applied to the DUT) and Expect values (output value expected from the DUT) for each cycle.

Because of the differences in internal formats and Tester capabilities, each test program is specific to a particular Test System. Test Programs are either coded with knowledge of the Test System requirements, or are modified to conform to those requirements when translated from an interchange format into the internal format.

When the Test System applies the Test Program to the device under test, device faults are detected as mismatches between Expect value and the values actually produced by the DUT. The Test System reports these mismatches in terms of the failing cycle number and pin name.

The Limits of Functional Test, Structural Test Alternative

As IC complexity has increased, to current devices with 10–100 million gates, they have become increasingly difficult to test effectively or efficiently using traditional functional test. Using normal device operations, it can be a complex task to establish the logic state required to detect a particular fault, and it becomes increasingly difficult to determine the fault coverage of a test program. Moreover, the largely manual effort of creating the test program becomes prohibitively expensive.

Complex ICs are typically built out of components in a hierarchical structure, and many of these components are reused in multiple ICs. There is a benefit to being able to develop tests for these components that can also be reused, and this is typically not feasible with traditional functional test. There is also a benefit, when faults are detected, to be able to identify where in the hierarchy of components the fault occurred.

In response to these issues, design methodologies referred to as Design for Test (DFT) have been developed to allow much of the test development process to be automated. A commonly used DFT approach is internal scan test. It relies on the addition of specialized test circuitry to the IC. In contrast to functional test, which exercises the device as a whole using its normal operating mode, scan test uses the test circuitry in a separate scan mode to set or examine the state of the IC (or part of the IC), thus bypassing the intractable task of performing these operations using the normal operating mode. Since the device state is accessible, scan tests can exercise circuitry locally. This allows tests to be generated automatically, and allows the automated isolation of faults detected by the tests.

How Scan Test Works

The test circuitry added to the IC for scan test modifies the internal nodes of the device that retain state information from one cycle to the next, allowing these Scan Cell nodes to be linked together in a Scan Chain with its ends linked to a Scan Input and Scan Output pin. In scan mode, the Scan Chain functions as a shift register, allowing data values to be scanned into the scan cells at one end and out the other, one per cycle. The scan circuitry adds 10–15% to the circuitry of the IC. A typical configuration splits the scan cells among multiple scan chains. A greater number of chains reduces the number of cycles required to load and unload the IC state, but each chain requires connections to two pins. Depending on how this tradeoff is weighed, a typical configuration may contain 16–256 scan chains, with 200–2,000 scan cells per chain. The Scan Input and Scan Output normally share pins that serve a different purpose during normal device operation.

Conceptually, a scan test consists of a load phase, in which the scan chains are shifted multiple cycles in scan mode to set the state of the DUT, an exercise phase, consisting of one or more cycles in normal operational mode, and an unload phase, in which the scan chains are again shifted multiple cycles in scan mode to examine the state resulting from the exercise phase. An Automated Test Pattern Generation (ATPG) tool is used to automatically generate scan tests. A large number of scan tests are required to achieve high levels of fault coverage—a typical scan test program consists of 1,000–10,000 tests. Unlike traditional functional tests, scan tests have a highly consistent organization imposed by the ATPG tool, and, because each test resets the DUT state, there are no interdependencies between tests.

In practice, the size and execution time of a scan test program can be cut roughly in half by the simple optimization of overlaying the load and unload phases of successive tests. Each shift cycle unloads a result value for the completed test and at the same time loads a setup value for the next test.

In contrast to the cyclized form traditional test systems use to represent test programs, ATPG tools use a procedural representation of the test steps and a structured representation of the data values applied during the test. Data values may be represented as a parallel vector, a set of values to be applied to specified pins during a single cycle, or as a serial vector, a series of values to be applied to a scan chain across multiple cycles. Typically, the characteristic sequence of cycles required to perform the scan load/unload phase is specified as a separate procedure that is then invoked by individual tests with appropriate data values. A traditional tool for a test system translates this ATPG format into the tester's cyclized internal form.

Mismatch between Traditional Testers and Scan Test

The cyclized representation of test programs used by traditional test systems is not an effective representation for scan tests, for a variety of reasons.

A great deal of information is lost in the translation from the ATPG representation. Device specifications, in particular the structure of scan chains is lost. In scan tests, most test cycles are scan load/unload, not exercise cycles. This distinction is lost in the cyclized representation. Nor, typically, does it preserve the location of test boundaries.

The translation process typically involves tester-specific adjustments to the test program, so that the resulting program is slightly different from the original ATPG definition. In particular, signal timing and levels may be adjusted to meet tester constraints. These changes are not apparent in the resulting representation.

In traditional functional test, test data is associated with pins, but most of the data in scan tests is associated with scan cells internal to the IC. The association of this scan data with pins is merely an artifact of the scan load/unload mechanism. It is extremely difficult to determine which data values in the cyclized representation are scan data, much less the scan cells to which they correspond. (In summary, it requires locating the bounds of the load/unload cycles, identifying the scan input and scan output pins, and matching position of the value in the chain to a scan cell—a tedious and error-prone manual process.) Even determining which test a data values belongs to is not easy, and is complicated by the overlap between tests.

For traditional functional test programs, tests do not overlap. Tests can be executed selectively (if not compromised by interdependencies) by specifying a starting and ending cycle. The overlapping load/unload phases of scan tests interfere with this approach, and the traditional tester cannot perform the more complex split required to isolate scan tests for selective execution.

The problems caused by this mismatch are most apparent when an engineer has to diagnose failures in the test program. In particular, issues that can occur in the setup of the ATPG and in the translation of the scan patterns to the tester format often result in incorrect scan tests that the engineer must be debug. Typical scan test programs are enormous, and because of the mismatch, the traditional test system presents this data to the engineer in cyclized form—as a huge array of numbers—missing almost all the structural information that was present in the ATPG representation.

SUMMARY

Various embodiments of an IC test system (tester) described herein include a tool or utility for creating IC test programs and viewing and analyzing tests and test results. The tool can be implemented as a software application program run on a computer system.

The tool creates test programs directly from ATPG output while preserving knowledge of the scan chain structure so test data and test results can be provided in a variety of views that have meaning from the ATPG perspective and from the perspective of the internal structure of the IC. In particular, the tool preserves knowledge of the device specifications included in the ATPG output, including the scan chain structures. The tool preserves knowledge of the procedural definition of the test program. The tool separates individual tests by recognizing delineations in test program. The tool preserves knowledge of the tester-independent test program specification, independent of any required tester-specific adjustments. The tool also recognizes the delineation between individual scan tests from the ATPG import so that test failures can be associated with specific scan tests, allowing the failure information to be fed back to the ATPG such that the ATPG tool can be used to isolate the cause of the failures.

The tool provides views of the IC signal (pin) list and scan structures, by chain, or by device hierarchy. The tool provides a view of the mapping between IC signal and tester pins.

The tool further provides a view of the test program in cyclized execution form. It also provides a view of the test program in a form that preserves the procedural representation of the test steps and structured representation of the data values from the ATPG output. Associated with this procedural view, it provides views of the data vectors applied by the test program—parallel vectors organized by signal, and serial vectors organized by scan chain or device structure.

The tool allows the user to navigate between these different views as an aid in verifying test correctness and analyzing test results.

The tool allows the test program to be modified by editing data values in the test program specification, by editing the procedural flow of the test program specification, and by editing the cyclized execution form.

The tool executes the test program on a tester in its entirety, or selected tests only.

The tool provides views of the test results aligned with the test data. The results are provided in both the cyclized view and in the data vector views associated with the procedural view.

The tool identifies failures in test results by failing cycle/signal in the cyclized view and by failing signal or scan cell in the data vector views. The tool identifies signals with associated failures in the signal list view, and scan cells with associated failures in the scan structures view.

The tool assembles test failure results for analysis and fault isolation by ATPG tools.

Benefits

The tool provides presentation, navigation, and editing matched to the structure of the scan-based test program and to the representation of the test program produced by the ATPG tools, all of which dramatically simplify the tasks of locating pertinent information in the test program and making modifications to it, and greatly reduce the risk of misidentified information of misapplied modifications.

The tool integrates test failure information into the presentation of the test program in ways that facilitate rapid identification of the source of individual failures and improve the visualization of patterns of multiple failures.

The tool uses rich knowledge of the structure of the test program to allow more flexible control over program execution, and to correctly transfer failure information to the ATPG tools for analysis.

These advantages combine to enable increased productivity on the part of the engineers involved in developing and debugging DFT tests, and engineers involved in analyzing test results and analyzing the cause of test failures.

Additional features and advantages of the invention will be made apparent from the following detailed description of

BRIEF DESCRIPTION OF THE DRAWINGS

FIG. 2 is a diagram depicting a very simple test program definition, consisting of two scan tests, for the device in FIG. 1.

FIG. 3 is a diagram showing a cyclized test program corresponding to the test program definition in FIG. 2.

DETAILED DESCRIPTION

The following description details a scan test viewing and analysis tool, which in one implementation is incorporated into an IC tester adapted to perform scan tests on a subject IC device (the device under test or DUT). In the embodiment described more fully below with reference to FIG. 5, the scan test viewing and analysis tool 1000 is implemented in a tester control workstation 800 as a set of software components that operate on information in a Data Store 700 and interface to a Test Sequencer 600 in a test head 800. The software components include a Test Program Loader 100, Test Program Compiler 200, Device Definition Viewer/Editors 300, Test Program Viewer/Editors 400, and a Test Program Execution Controller 500. In alternative implementations, the scan test viewing and analysis tool can reside on a separate computer from the tester control workstation, or can be integrated into the tester as a single hardware unit.

For purposes of illustration, the description begins with an example 1100 of a DUT and scan test to which the scan test viewing and analysis tool can be applied.

Example DUT and Scan Test

Figure 1:
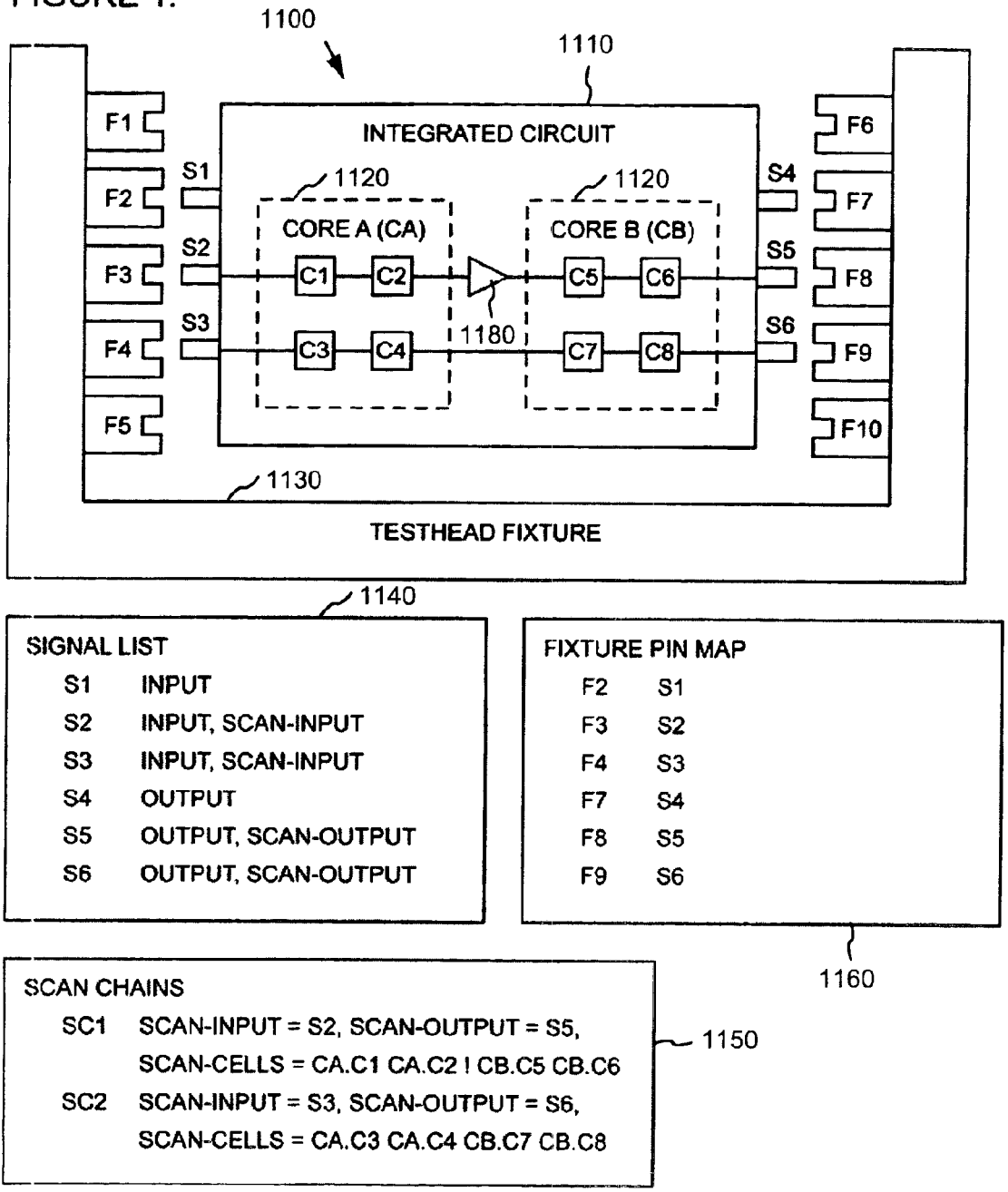
FIG. 1 is a block diagram depicting an exemplary simplified IC device with scan test circuitry as described in the Background section above, together with specifications of the IC's signals (pins), scan chains and fixture map.
Figure 5:
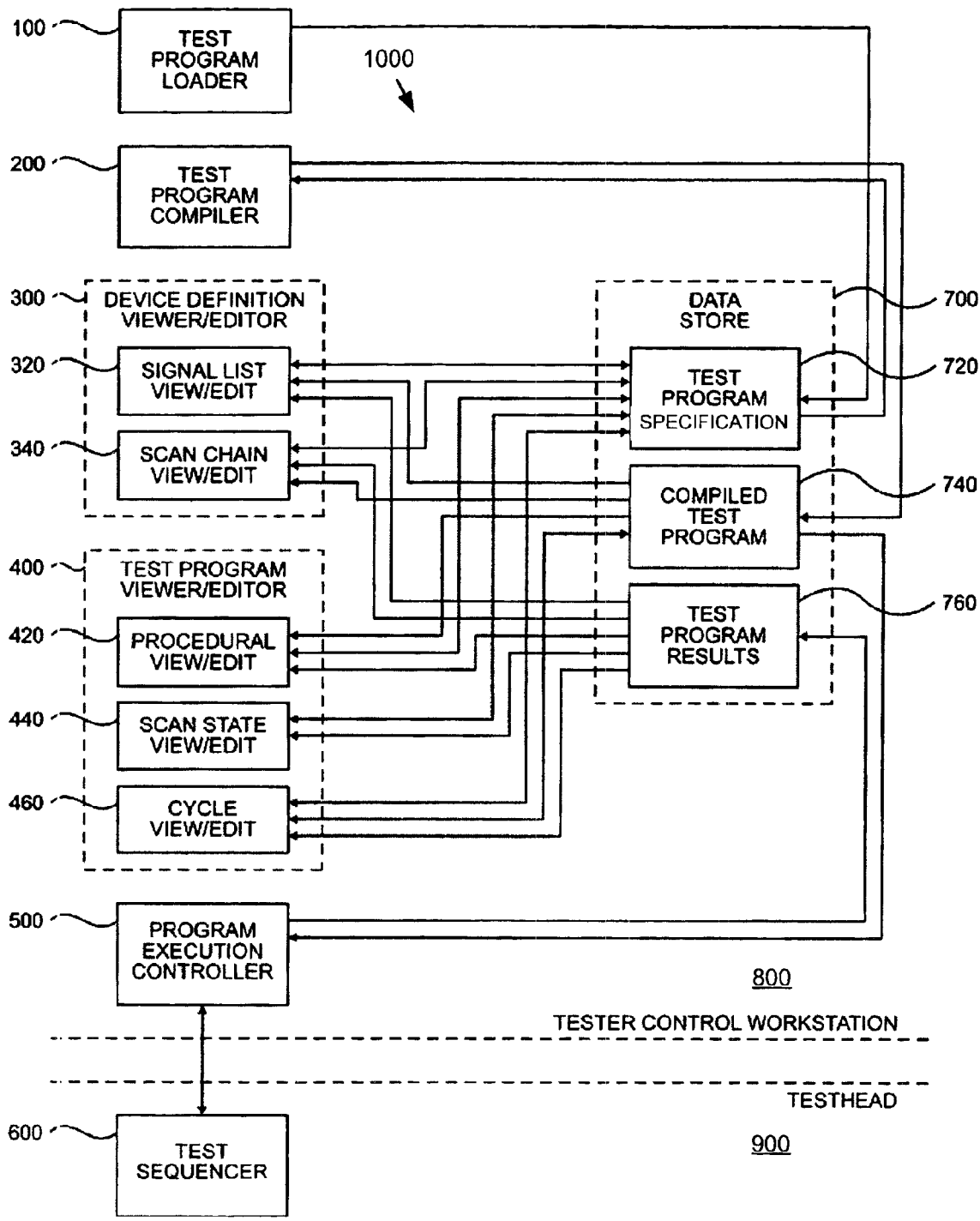
FIG. 5 is a block diagram of an IC tester incorporating the data store of FIG. 4 and a scan test creation, viewing and analysis tool according to an embodiment of the invention.

With reference now to FIG. 1, a simplified example 1100 of an IC device (DUT) 1110 illustrates the viewing and analysis of data relating to a scan test by the scan test viewing and analysis tool 1000 (FIG. 5). The example DUT 1110 includes scan test circuitry 1120, with a set of scan test nodes (C1, C2, . . . , C8) connected in two scan test chains (SC1 and SC2). The DUT uses pins S2 and S3, respectively, to input scan test patterns into the nodes, and pins S5 and S6 for output of test results. In this example, the IC device is situated in a test head fixture 1130 of the IC tester for purposes of testing using the scan test viewing and analysis tool. The test head fixture 130 includes a set of pin receptacles (F1, F2, . . . , F10) for interconnecting with the DUT pins (S1, . . . , S6). The DUT 1110 depicted in FIG. 1 is simplified for expository convenience. It should be readily apparent that a more typical example would be much more complex (e.g., with larger and more numerous scan chains), and further includes scan structures or controls that are not detailed in this simplified example.

A set of characteristics of the DUT that are pertinent to the scan test viewing and analysis tool are represented in specifications of a signal list 1140, scan chains 1150, and fixture-pin map 1160. The signal list 1140 is a listing of the signals present on the DUT's pins. For example, pins S2 and S3 are input pins for the scan test patterns for the scan chains, whereas S5 and S6 are output pins of scan test results from the respective scan chains. The fixture-pin map 1160 correlates the DUT pins to the respective receptacles in which the pins are seated in the test head fixture during testing. The scan chains specification 150 specifies input pin, output pin and scan cells of the respective scan chains in the DUT. These specifications are provided to the scan test viewing and analysis tool.

With reference now to FIG. 2, a simplified scan test consisting of two tests (referred to as tests 1 and 2) for the example DUT 110 (FIG. 1) is represented in a set of tables, including a table 1200 of test setup/result vectors (also called scan cells and signals table) and test program listings (one version 210 with no-overlap between tests and another version 1220 with load/unload overlap of the tests). The test setup/result vectors table 1200 shows the state settings required to set up each test (i.e., both the state of the scan cells on initiation of the exercise phase and the signal values applied during the exercise phase), and the state settings expected to result from the test. The two test program listings 1210, 1220 are a simplified procedural representation in the style of an ATPG test program representation of test programs to perform these respective scan tests on the tester. The simplified scan test is an example of scan tests to which the tool and techniques described herein can be applied. The tool and techniques can be applied to various kinds of scan tests, including, e.g., AC scan techniques, and scan tests with various clocks and controls.

In this Figure and others, the data values 0 and 1 represent input (or force, or internal scan cell) values, and the values L and H represent the corresponding output (expected or actual) values. The purpose for the distinct symbols is to provide a concise way to distinguish output values from the other uses.

FIG. 3 shows the overlapped version of the test program (as per the program definition 1220 in FIG. 2) in cyclized form. This cyclized test program 1300 representation is a tabular grid or array specifying the signals at the pins of the DUT per cycle for a sequence of cycles of the DUT.

Data Storage

Figure 4:
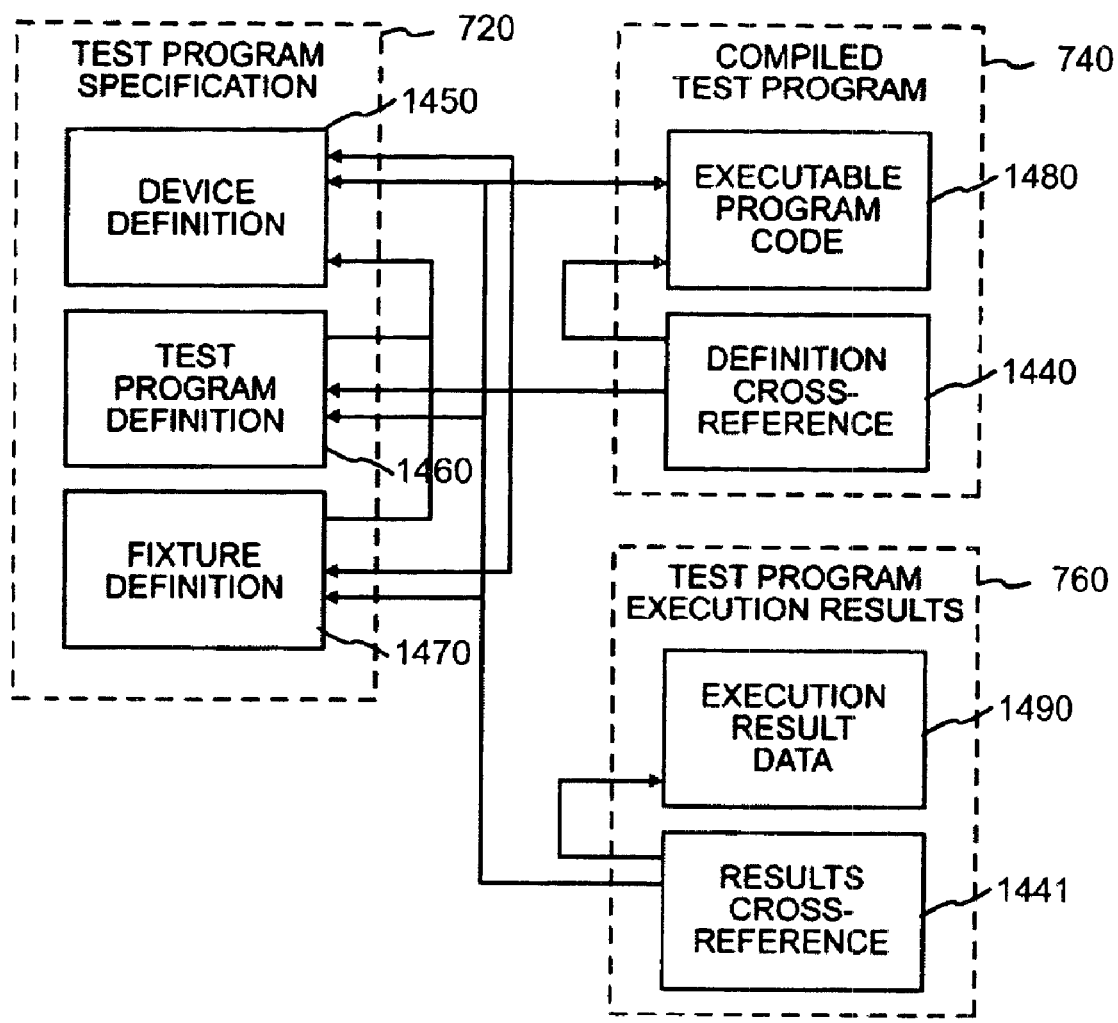
FIG. 4 is a diagram showing a relational organization of a data store that records the test program specification, compiled test program, and test execution results.

With reference now to FIG. 4, the scan test viewing and analysis tool 1000 maintains information of the scan tests in a data store 700 (FIG. 5). The data store 700 contains the test program specification 720, compiled test program 740, and test program results 760. The data store 1400 also includes cross-referencing information (definition cross-reference 1440 and results cross-reference 1441) that specifies the linkages between these elements. This cross referencing is a key aspect of the data store 1400. It provides the mechanism for combining information from the test program specification 720, the compiled test program 740, and the test program results 760 into composite views, and the mechanism for much of the navigation provided in the views of the IC definition, the test program, and the test execution results. FIG. 4 shows the organization of the data store 700.

In the data store, the test program specification 720 includes device definitions 1450, test program definitions 1460, and fixture definitions 1470.

The device definitions 1450 provide signal (pin) definitions (signal list 1140 of FIG. 1), and scan chain definitions (scan chains table 1150 of FIG. 1). Information in the definition for a scan chain includes its Scan Input and Scan Output signals, the number of Scan Cells in the chain and their names and order, and the location of any signal inverters 1180 (FIG. 1) in the chain (represented as '!'). The location of inverters, which invert the logic state of values passed down the scan chain, is an essential piece of information for being able to relate the signal value appearing at the scan input or output to the value stored in a scan cell.

The test program definitions 1460 provide the sequence of test steps in the program (as in test program listings 1210 and 1220 of FIG. 2), and the vectors of data to be applied to the device by the test program (as listed in the test setup/result vectors table 1200 of FIG. 2). The bounds of individual tests are recorded in the sequence of test steps. The data vectors include both parallel and serial vectors.

The fixture definitions 1470 consist of a mapping between tester pins and device signals (e.g., fixture pin map 1160 of FIG. 1).

Both the device and test program definitions 1450, 1460 retain the essential structure of the data generated by the ATPG tools, so that the invention can present them in a form compatible with the ATPG representation, and so that it can transmit test execution results back to the ATPG tools indexed to the ATPG representation in a way that allows the ATPG tools to interpret it correctly.

The device and test program definitions also retain the tester-independence of the data generated by the ATPG tools (they do not incorporate any tester-specific adjustments), so the tool 1000 (FIG. 5) can present the original definitions for comparison alongside any tester-specific adjustments.

The compiled test program 740 consists of the executable program code 1480 corresponding to the test program definition 1460, and the definition cross-reference 1440 between the program code and the test program specification 720. For the purposes of the scan test viewing and analysis tool, the key element of the program code is the cyclized representation of the data values applied to the device. The definition cross-reference 1440 provides a bidirectional mapping between each pin/cycle value in the compiled program 740 and its definition 1460 in the test program specification 720. The definition cross-reference 1440 also provides a mapping between the tester-independent definitions in the test program specifications 720 and the adjusted tester-dependent values in the compiled program 740.

The test program execution results 760 consists of the execution result data 1490, and the results cross-reference 1441 between the result data 1490, compiled test program 740, and test program specification 720. The cross-reference provides a tridirectional mapping among each pin/cycle value in result data, the corresponding pin/cycle location in the compiled test program, and its definition in the test program specification.

Scan Test Viewing and Analysis Tool

With reference again to FIG. 5, the scan test viewing and analysis tool 1000 is implemented in the tester control workstation 800 as a set of software components that operate on information in the data store 700 and interface to the test sequencer 600 in the test head 900. The software components include a test program loader 100, test program compiler 200, device definition viewer/editors 300, test program viewer/editors 400, and a test program execution controller 500. The tester control workstation 800 can be a computer, such as a personal computer, engineering workstation computer, mainframe or server computer, laptop, purpose-built tester controller, or other computing platform suitable for the requirements of the respective tester application. The tester control workstation 800 includes an interface or adapter for interconnecting with the test head 900. The tester control workstation 800 includes a memory system, a computer processor, and input and output devices. The memory system (e.g., a volatile primary memory such as RAM, and persistent secondary memory such as hard disk drives, etc.) contains the data store and the software components of the tool. The computer processor executes the software components. The views discussed below are visually presented to the user on the output devices (e.g., a display or monitor, a printer, or like). The input devices (e.g., a keyboard, mouse and the like) receive user input such as for navigating among the views, editing the test program, and controlling test execution on the tester.

Test Program Loader

The test program loader 100 translates the test program definition 720 generated by the ATPG tool from its exchange format to the internal representation used by the scan test viewing and analysis tool 1000 and places the results in the data store 700. In the processes, it converts the textual representation used for exchange to a more efficient machine-processable representation 720, while preserving the structural information present in the original.

The loader 100 identifies individual test boundaries as it performs the translations. Within overlapped scan load/unload phases it distinguishes the data pertaining to each test and separates the overlapped phases. It relies on the standardized format and annotations of the ATPG output to locate the test boundaries, and in performing the data separation it relies on specifications in the ATPG output that identify the scan load/unload data vectors.

Test Program Compiler

The test program compiler 200 translates from the test program definition 720 to the compiled test program 740 and places the results in the data store. In doing so, it imposes tester-specific adjustments on the program definition to produce output that the tester is capable of executing. It also combines the load/unload phases of successive scan tests where this is possible—this will restore the overlaps that were separated by the test program loader 100, but also, if the test program was modified or tests rearranged by use of the test program viewer/editors 300, 400, this may introduce new overlaps made possible by the modifications.

The test program compiler 200 constructs the definition cross-reference 1440 (FIG. 4) between the test program definition and the compiled test program and also places it in the data store 700.

Program Execution Controller

The program execution controller 500 performs all the operations required to prepare the compiled test program for execution on the DUT by the test head, control the execution of the program, and collect the test results 760 and place them in the data store 700. This last step has particular relevance to the scan test viewing and analysis tool 1000. In addition to storing the failure data resulting from the test, the program execution controller 500 uses information from the compiled test program to construct the results cross-reference 1441 linking these result values to the corresponding locations in the compiled test program 740 and the test program definition 720.

Device Definition Viewer/Editors

The device definition viewer/editors 300 operate on device definition components (e.g., signal list 1140 and scan chain definition 1150 of FIG. 1) of the test program specification 720 in the data store 700, and they present views of this data and allow the user to make modifications (e.g., via a graphical user interface (GUI) presented on a display of the tester control workstation 800). The views refer to the compiled test program 740 in the data store 700 and use its definition cross-reference 1440 to display summary information from the tester-specific adjustments performed by the test program compiler 200. The views refer to the test results in the data store 700 and use the results cross-reference 1441 to display summary information (error summaries) from test results.

Figure 7:
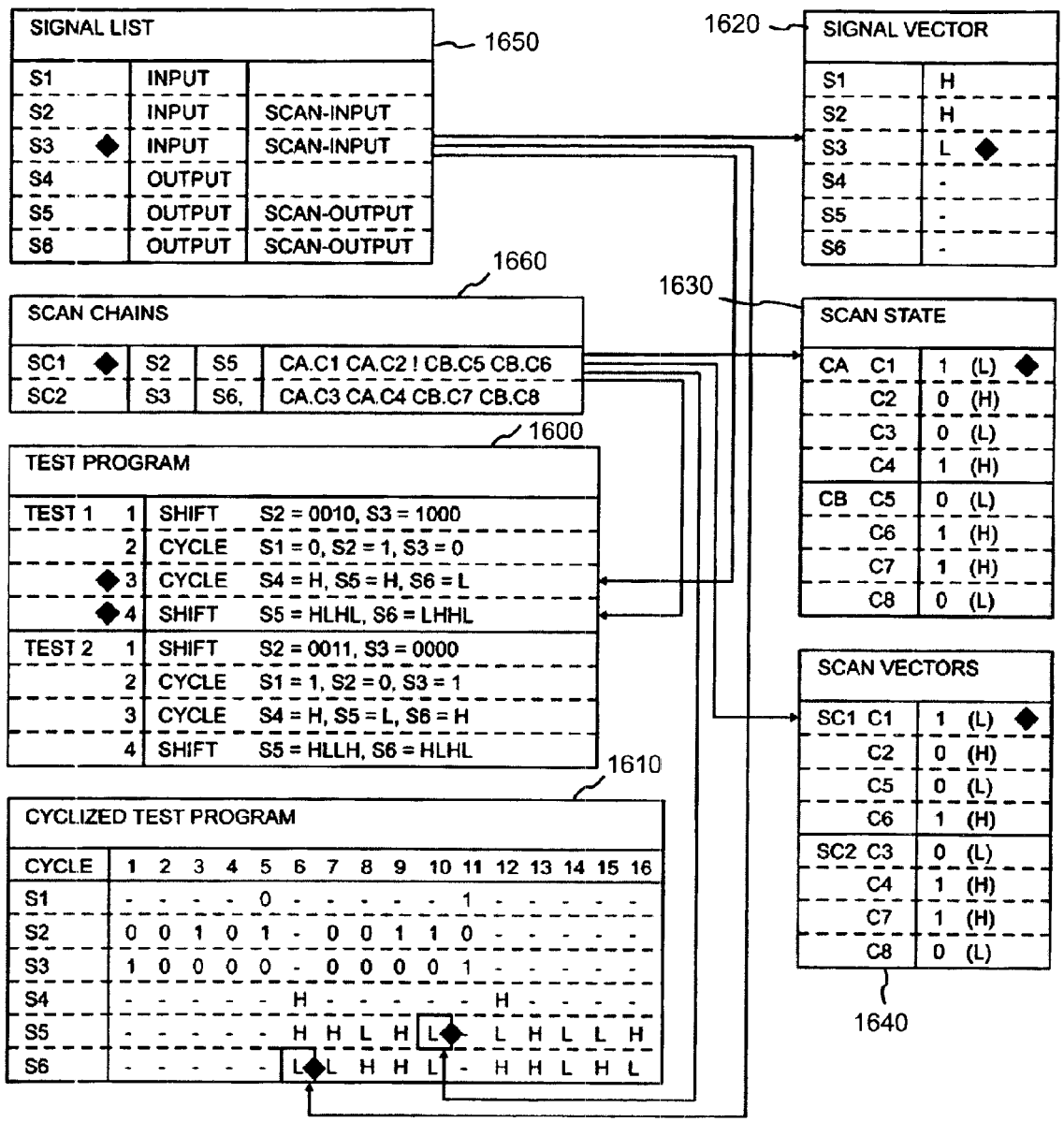
FIG. 7 depicts the views of FIG. 6 with dynamic navigational links between the views.

The Device Definition Viewer/Editors 300 allow navigation to test program views through error summary references. That is, where an error summary is associated with an element of a device definition view, the user can navigate to the individual error instances in the test program views. FIG. 7 illustrates these navigational linkages, as further discussed below.

Test Program Viewer/Editors

The test program viewer/editors 400 operate on the test program definition 1460 and fixture definition 1470 components of the test program specification 720 and compiled test program 740 in the data store, and they present views of this data and allow the user to make modifications (e.g., via a graphical user interface (GUI) presented on a display of the tester control workstation 800). The test program viewer/editors 400 use the definition cross-reference 1440 of the compiled test program 740 to incorporate annotations of tester-specific adjustments into their presentation of the test program definition 1460. The test program viewer/editors 400 refer to the test results 760 in the data store 700 and use the results cross-reference 1441 to incorporate annotations of error occurrences into their presentation of the test program definition 1460 and compiled test program 740. The error annotations consist of both detail information (actual output values placed alongside expected values) and summary information (indications that particular signals, cycles, or test steps have associated errors).

Figure 6:
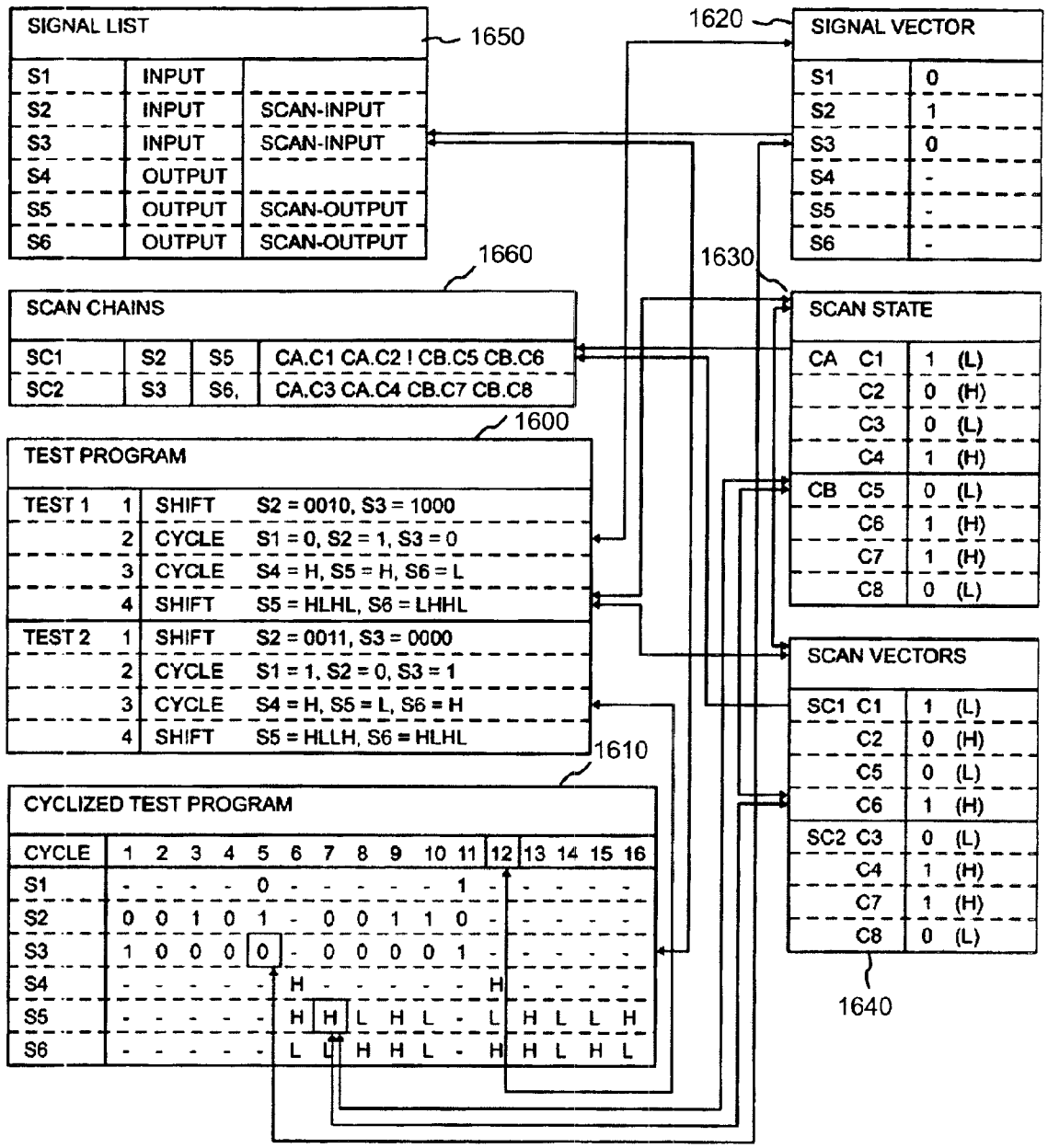
FIG. 6 depicts principal views presented by the tool in FIG. 5 for the exemplary test program of FIG. 3, and static navigational links between corresponding structures in the various views.

The test program viewer/editors 400 allow navigation to device definition views through device structure references. That is, where a signal or scan chain reference appears in a test program view, the user can navigate to the definition of that structure in the device definition views. Similarly, the test program viewer/editors 400 allow navigation between test program views through common elements. FIG. 6 illustrates these navigational linkages, as further discussed below.

Views

FIG. 6 shows examples of the principal views presented by the scan test viewing and analysis tool, and the static navigational links between them. More specifically, the navigational links shown here connect corresponding structures in the various views. The example data displayed in the views is that of the test program specified in FIGS. 1–3.

FIG. 7 shows the same views as FIG. 6, but shows the dynamic navigational links between them. More specifically, the navigational links shown here rely on test results, connecting structures where summary error information is collected to the individual occurrences of those errors. The black diamonds are a schematic indication of error locations.

The views are depicted in FIGS. 6 and 7 as simplified schematics of displays that would appear in the tool GUI. The exact mechanism for traversing the links can vary in the GUI of different implementations of the tool, but a typical implementation would have the user select the source of a link with pointing device, be presented with a pop-up menu of navigation choices, and select one of the destination view choices with the pointing device.

The test program view 1600 is the primary presentation of the test program definition 1460. It also incorporates summary information of errors associated with particular test steps. It allows the user to edit test steps within the test program definition and applies the changes to the data store 700.

The test program view 1600 allows the user to navigate to a signal vector view 1620, a scan state view 1630 and a scan vector views 1640 associated with particular test steps. The test program view 1600 further allows the user to navigate to the location in the cyclized test program view 1640 corresponding to a particular test step.

The cyclized test program view 1610 is the primary presentation of the compiled test program. It also presents error occurrences associated with particular data values, and incorporates summary information of errors associated with particular signals. It allows the user to edit test data values in the compiled test program and applies the changes to the data store.

The cyclized test program view 1610 allows the user to navigate to the respective signal vector view 1620, the respective scan state view 1630 and the respective scan vector view 1640 associated with particular data values, and it allows the user to navigate to the location in the test program view 1600 corresponding to a particular test cycle.

The signal vector view 1620 provides a detailed view of parallel vectors specified in the test program definition. It also presents error occurrences associated with particular vector elements. It allows the user to edit the vector values in the test program definition 1460 (FIG. 4) and applies the changes to the data store 700 (FIG. 5).

The signal vector view 1620 allows the user to navigate to the test program view 1600 at the location of the step that incorporates the vector, it allows the user to navigate to the cyclized test program view 1610 at the location of the cycle/signal corresponding to a particular vector value, and it allows the user to navigate to the signal list view 1650 at the location of the signal corresponding to a particular value.

The scan state view 1630 and scan vector view 1640 provide two alternate detailed views of the scan vectors specified in the test program definition 1460 (FIG. 4), and both incorporate summary information of errors associated with particular scan values. Both allow the user to edit the vector values in the test program definition and apply the change to the data store 700 (FIG. 700).

The scan state and scan vector views 1630, 1640 allow the user to navigate to the test program view 1600 at the location of the step that incorporates the vector, it allows the user to navigate to the cyclized test program view 1610 at the location of the cycle/signal corresponding to a particular vector value, and it allows the user to navigate to the scan chain definition view 1660 at the location of the scan chain corresponding to a particular value.

The scan state view 1630 organizes the data in a collection of serial vectors according to cell names. By arranging the data by cell name, it groups together cells that are logically related to each other in the device, and groups them by device core. The scan vector view organizes the data in a collection of serial vectors according to their position in the vector. By arranging the data by position, it presents them as they are connected within the scan chain. For a user looking for patterns in error results from a test, the two views are In view of the many possible embodiments to which the principles of our invention may be applied, we claim as our invention all such embodiments as may come within the scope and spirit of the following claims and equivalents thereto.

We claim:

1. A method of analyzing scan tests of an IC device, comprising:

processing data of a device definition, a test program definition, and test execution results to produce cross-reference data interrelating signals, scan chains, test execution results and steps of the test program;

rendering views for presentation on a display, the views including at least a cyclized test view, a procedural test program view, and views of a signal vector, scan state, and scan vector;

selectively presenting the views on the display;

navigating responsive to a user navigation input from a location selected in a current view to a correlated location in a user directed other of the views based on the cross-reference data;

modifying the test program definition in response to user editing inputs;

re-executing the modified test program;

acquiring test execution results from execution of the modified test program; and repeating the above-recited processing, rendering, presenting and navigating steps based on the modified test program for analyzing the modified test of the IC device.

2. A scan test viewing and analysis tool, comprising:

means for processing data of a device definition, a test program definition, and test execution results to produce cross-reference data interrelating signals, scan chains, test execution results and steps of the test program;

means for rendering views for presentation on a display, the views including at least a cyclized test view, a procedural test program view, and views of a signal vector, scan state, and scan vector;

means for selectively presenting the views on the display;

means for navigating responsive to a user navigation input from a location selected in a current view to a correlated location in a user directed other of the views based on the cross-reference data;

means for modifying the test program definition in response to user editing inputs;

means for re-executing the modified test program;

means for acquiring test execution results from execution of the modified test program; and means for causing the above-recited means for processing, rendering, presenting and navigating to repeat their operations based on the modified test program for analyzing the modified test of the IC device.

3. A computer-readable program carrying medium having software programming of a scan test tool for an IC tester stored thereon and executable on a computer processor to perform a method comprising:

processing data of a device definition, a test program definition, and test execution results to produce cross-reference data interrelating signals, scan chains, test execution results and steps of the test program;

rendering views for presentation on a display, the views including at least a cyclized test view, a procedural test program view, and views of a signal vector, scan state, and scan vector;

selectively presenting the views on the display;

navigating responsive to a user navigation input from a location selected in a current view to a correlated location in a user directed other of the views based on the cross-reference data;

modifying the test program definition in response to user editing inputs;

re-executing the modified test program;

acquiring test execution results from execution of the modified test program; and repeating the above-recited processing, rendering, presenting and navigating steps based on the modified test program for analyzing the modified test of the IC device.

* * * * *